(12) United States Patent
Lin et al.

(10) Patent No.: US 9,276,592 B2
(45) Date of Patent: Mar. 1, 2016

(54) MULTIMEDIA INTERFACE RECEIVING CIRCUIT

(71) Applicant: MStar Semiconductor, Inc., Hsinchu Hsien (TW)

(72) Inventors: Po-Nien Lin, Zhubei (TW); Jiunn-Yih Lee, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/582,318

(22) Filed: Dec. 24, 2014

(65) Prior Publication Data

US 2015/0188697 A1 Jul. 2, 2015

(30) Foreign Application Priority Data

Dec. 26, 2013 (TW) .............................. 102148458 A

(51) Int. Cl.
| | |
|---|---|
| H04B 1/10 | (2006.01) |
| H03L 7/085 | (2006.01) |
| G09G 5/00 | (2006.01) |
| H04L 7/033 | (2006.01) |
| H04L 7/00 | (2006.01) |

(52) U.S. Cl.
CPC ................ *H03L 7/085* (2013.01); *G09G 5/008* (2013.01); *H04L 7/033* (2013.01); *H04L 7/0004* (2013.01); *H04L 7/0008* (2013.01)

(58) Field of Classification Search
CPC ......... H04L 7/033; H03L 7/087; H03L 7/091; H03L 7/0891; H03L 7/0814; H03L 7/093; H03L 7/18
USPC ................... 375/316–352, 354–37, 354–376, 375/211–215, 219–223, 257–294
See application file for complete search history.

(56) References Cited

U.S. PATENT DOCUMENTS

| | | | | |
|---|---|---|---|---|
| 6,509,773 | B2* | 1/2003 | Buchwald et al. | 327/248 |
| 8,732,376 | B2* | 5/2014 | Saitoh | G06F 3/041 345/173 |
| 2002/0075981 | A1 | 6/2002 | Tang et al. | |
| 2008/0235551 | A1* | 9/2008 | Lin | H04L 25/03019 714/746 |
| 2009/0147903 | A1* | 6/2009 | Kikuchi | H03L 7/07 375/376 |
| 2009/0222905 | A1* | 9/2009 | Choi | G09G 5/006 726/11 |
| 2010/0061497 | A1* | 3/2010 | Buchmann | G06F 13/4291 375/371 |
| 2010/0090723 | A1 | 4/2010 | Nedovic et al. | |
| 2010/0328540 | A1* | 12/2010 | Wu | G09G 5/006 348/723 |
| 2011/0125601 | A1* | 5/2011 | Carpenter | G06Q 30/06 705/26.1 |

(Continued)

OTHER PUBLICATIONS

TIPO Office Action, Dec. 24, 2015, 5 pages.

*Primary Examiner* — James M Perez
(74) *Attorney, Agent, or Firm* — Edell, Shapiro & Finnan, LLC

(57) ABSTRACT

A multimedia interface receiving circuit includes a phase-locked loop (PLL) and four signal processing channels. Each of the channels includes a phase detecting circuit. In a High-Definition Multimedia Interface (HDMI) configuration, one of the processing channels is disabled, and the PLL provides a locked clock signal to the other three processing channels. Each of the other three processing channels adjusts the phase of the locked clock signal to generate a sampling clock signal. In a DisplayPort (DP) configuration, the PLL changes to connect to the phase detecting circuit of one of the four signal processing channels to form an analog clock data recovery (ACDR) circuit to generate a fundamental clock signal. Each of the three other processing channels adjusts the phase of the fundamental clock signal to generate the sampling clock signal.

4 Claims, 15 Drawing Sheets

(56) References Cited

U.S. PATENT DOCUMENTS

| | | | |
|---|---|---|---|
| 2012/0054517 A1* | 3/2012 | Fuh | G06F 1/3287 713/320 |
| 2012/0287344 A1* | 11/2012 | Choi | H04N 5/265 348/705 |
| 2014/0006808 A1* | 1/2014 | Sizikov | G06F 1/26 713/300 |
| 2014/0244880 A1* | 8/2014 | Soffer | G06F 3/0227 710/300 |
| 2015/0006872 A1* | 1/2015 | Sonobe | G06F 9/4401 713/2 |
| 2015/0098527 A1* | 4/2015 | Wang | H04L 7/033 375/316 |
| 2015/0280761 A1* | 10/2015 | Lin | H04L 7/033 375/340 |

* cited by examiner

MULTIMEDIA INTERFACE RECEIVING CIRCUIT

This application claims the benefit of Taiwan application Serial No. 102148458, filed Dec. 26, 2014, the subject matter of which is incorporated herein by reference.

BACKGROUND OF THE INVENTION

1. Field of the Invention

The invention relates in general to a multimedia receiving interface, and more particularly to a circuit architecture of a multimedia receiving interface.

2. Description of the Related Art

With the constant progress of electronic technologies, display apparatuses of all diversities are becoming more and more popular. Various kinds of electronic device, such as television systems, computer systems, projectors, digital cameras, disk players, mobile phones and game consoles, all need a good video/audio transmission interface. To optimize the compatibility with other peripheral devices, many electronic devices simultaneously includes several multimedia receiving interfaces such as High-Definition Multimedia Interface (HDMI), Mobile High-Definition Link (MHL) and DisplayPort (DP) standards.

FIG. 1 shows a function block of a front-end of an HMDI receiving circuit. As shown in FIG. 1, four pairs of differential signals CK, B, G and R are inputted into the HDMI receiver. The clock signal CK is provided to a clock signal receiver 101 and a phase-locked loop (PLL) 102, and the image data signals B, G and R are respectively provided to analog front-end circuits 110A to 110C. The PLL 102 generates a ten-fold frequency signal or a forty-fold frequency signal from the clock signal (i.e., a clock frequency of a transmitter), and transmits the generated signal to the phase adjusting circuits 140A to 140C. Sampling circuits 120A to 120C sample input signals by the sampling clock signals provided by the phase adjusting circuits 140A to 140C. Through multiplexers 150A to 150C, sample results of the sampling circuits 120A to 120C are respectively transmitted to digital clock data recovery (DCDR) circuits 130A to 130C. Detection results of the DCDR circuits 130A to 130C are feedback to corresponding phase adjusting circuits 140A to 140C, which then accordingly adjust phases of respective output signals (i.e., sampling clock signals utilized by the sampling circuits 120A to 120C), so that the sampling circuits 120A to 120C may generate preferred sample results.

FIG. 2 shows a function block of a front-end of an MHL receiving circuit. A pair of differential input signals can carry a clock signal and a data signal, and are provided to a clock signal receiver 201 and an analog front-end circuit 210. A clock signal extracted from the clock signal receiver 201 and a data signal having been preliminarily processed by the analog front-end circuit 210 are provided to an analog clock data recovery (ACDR) circuit 220 for the use of clock recovery. An output signal from the ACDR circuit 220 is transmitted to a subsequent circuit through a demultiplexer 250.

FIG. 3 shows a function block of a front-end of a DP receiving circuit. As shown in FIG. 3, four pairs of differential image data signals Data#0, Data#1, Data#2 and Data#3 are inputted into a DP receiver, and are respectively provided to analog front-end circuits 310A to 310D. Signals having been preliminarily processed by the analog front-end circuits 310A to 310D are respectively provided to subsequent ACDR circuits 320A to 320D for clock data recovery.

In the prior art, an electronic device simultaneously provided with an HDMI receiving circuit, an MHL receiving circuit and a DP receiving circuit is designed to include three independent receiving circuits, hence high hardware costs.

SUMMARY OF THE INVENTION

The invention is directed to a multimedia interface receiving circuit. By appropriately and selectively controlling a signal connection arrangement, the multimedia interface receiving circuit is adapted to be set to an HDMI receiving circuit, an MHL receiving circuit or a DP receiving circuit. Through sharing circuit elements, the multimedia interface receiving circuit of the present invention effectively reduces hardware costs compared to the conventional solution of adopting three independent receiving circuits.

According to an embodiment of the present invention, a multimedia interface receiving circuit is provided. The multimedia interface receiving circuit includes a phase-locked loop (PLL) and four signal processing channels. The PLL includes a phase frequency detector. Each of the four signal processing channels includes a phase detecting circuit. In an HDMI configuration, one of the signal processing channels is disabled, and each of the other three signal processing channels receives an input signal. The PLL provides a locked clock signal to the three signal processing channels. Each of the three signal processing channels adjusts a phase of the locked clock signal according to the input signal to generate a sampling clock signal for the use of the phase detecting circuit. In a DP configuration, when the PLL satisfies a lock condition, the phase frequency detector in the PLL is disabled, and the PLL changes to be connected to the phase detecting circuit of one of the four signal processing channels to form an analog clock data recovery (ACDR) circuit to generate a fundamental clock signal. The fundamental clock signal is provided to the other three signal processing channels to serve as a fundamental clock signal. Each of the three signal processing channels adjusts a phase of the fundamental clock signal to generate a sampling clock signal for the use of the phase detecting circuit.

According to another embodiment of the present invention, a multimedia interface receiving circuit is provided. The multimedia interface receiving circuit includes four signal processing channels, each of which including a phase detecting circuit and a PLL. In an HDMI configuration, one of the signal processing channels is disabled, and the PLL of each of the other three channels generates a locked clock signal, and adjusts the phase of the locked clock signal to generate a sampling clock signal for the use of the phase detecting circuit. In a DP configuration, when the PLL of each of the four signal processing channels satisfies a lock condition, a phase frequency detector in the PLL is disabled. The PLL changes to be connected to the phase detecting circuit of the signal processing channel including the PLL to form an ACDR circuit.

According to another embodiment of the present invention, a multimedia interface receiving circuit is provided. The multimedia interface receiving circuit includes a PLL and at least two signal processing channels. The PLL includes a phase frequency detector, and is configured to generate a fundamental clock signal. Each of the at least two signal processing channels includes an analog front-end circuit, a phase detecting circuit, a demultiplexer, a digital clock data recovery (DCDR) circuit, a phase adjusting circuit and a multiplexer. The analog front-end circuit receives an input signal and accordingly generates a processed signal. The phase detecting circuit receives the processed signal, and samples the processed signal to generate a sampled signal. The demultiplexer converts the sampled signal to a demultiplexed signal.

The DCDR circuit performs a DCDR process on the demultiplexed signal to generate corresponding phase adjustment information. The phase adjusting circuit receives the phase adjustment information and the fundamental clock signal, and adjusts the phase of the fundamental clock signal according to the phase adjustment information to generate a sampling clock signal. The multiplexer selectively transmits one of the fundamental clock signal and the sampling clock signal to the phase detecting circuit according to a configuration of the multimedia interface receiving circuit.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 4A:
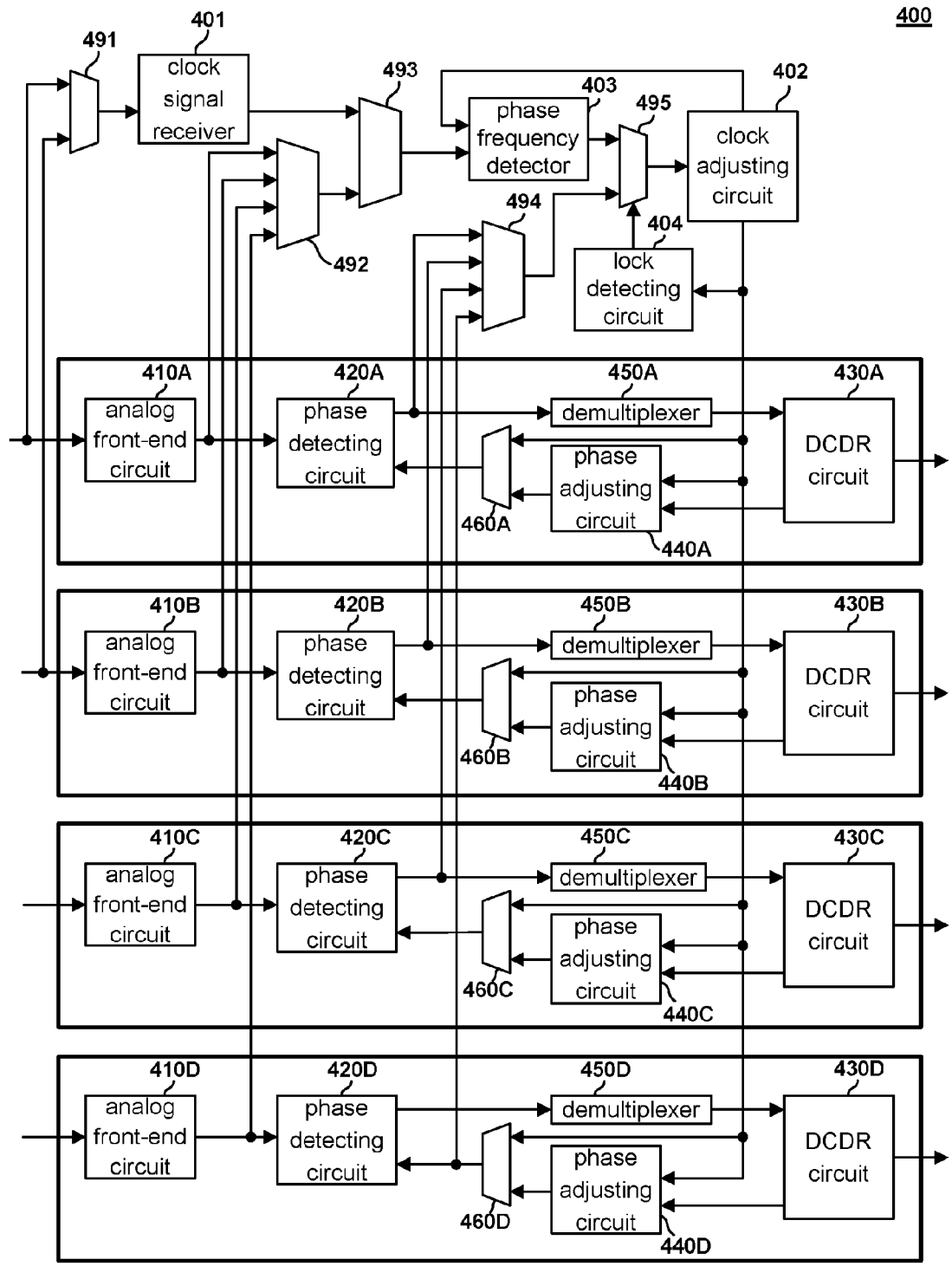
FIG. 4(A) to FIG. 4(D) are function block diagrams of a multimedia interface receiving circuit according to an embodiment of the present invention.

FIG. 4(A) shows a function block diagram of a multimedia interface receiving circuit according to an embodiment of the present invention. In practice, the multimedia interface receiving circuit 400 may be integrated into various electronic devices such as a television system, a computer monitor and a projector, or may be an independent unit.

As shown in FIG. 4(A), the multimedia interface receiving circuit 400 includes a clock signal receiver 401, a clock adjusting circuit 402, a phase frequency detector 403, a lock detecting circuit 404, analog front-end circuits 410A to 410D, phase detecting circuits 420A to 420D, digital clock data recovery (DCDR) circuits 430A to 430D, phase adjusting circuits 440A to 440D, demultiplexers 450A to 450D, multiplexers 460A to 460D, and multiplexers 491 to 495. More specifically, the multimedia interface receiving circuit 400 includes four signal processing channels, each of which including one analog front-end circuit, one phase detecting circuit, one DCDR circuit, one phase adjusting circuit, one demultiplexer and one multiplexer. Each of the detecting circuits includes a sampling circuit and a phase determining circuit (not shown). As shown in FIG. 4(A), the multimedia interface receiving circuit 400 may receive four pairs of input signals at input ends of the analog front-end circuits 410A to 410D. The received signals are usually in form of differential signals. By appropriately controlling and selecting a signal type of the multiplexers, the multimedia interface receiving circuit 400 may be equivalently set to a High-Definition Multimedia Interface (HDMI) receiving circuit, a Mobile High-Definition Link (MHL) receiving circuit or a DisplayPort (DP) receiving circuit. Details are given below.

In the accompanying drawings, effective circuit elements and circuit connection lines are depicted in solid lines or solid-line frames, and ineffective or disabled circuit elements and circuit connection lines are depicted in dotted lines or dotted-line frames.

Figure 4B:
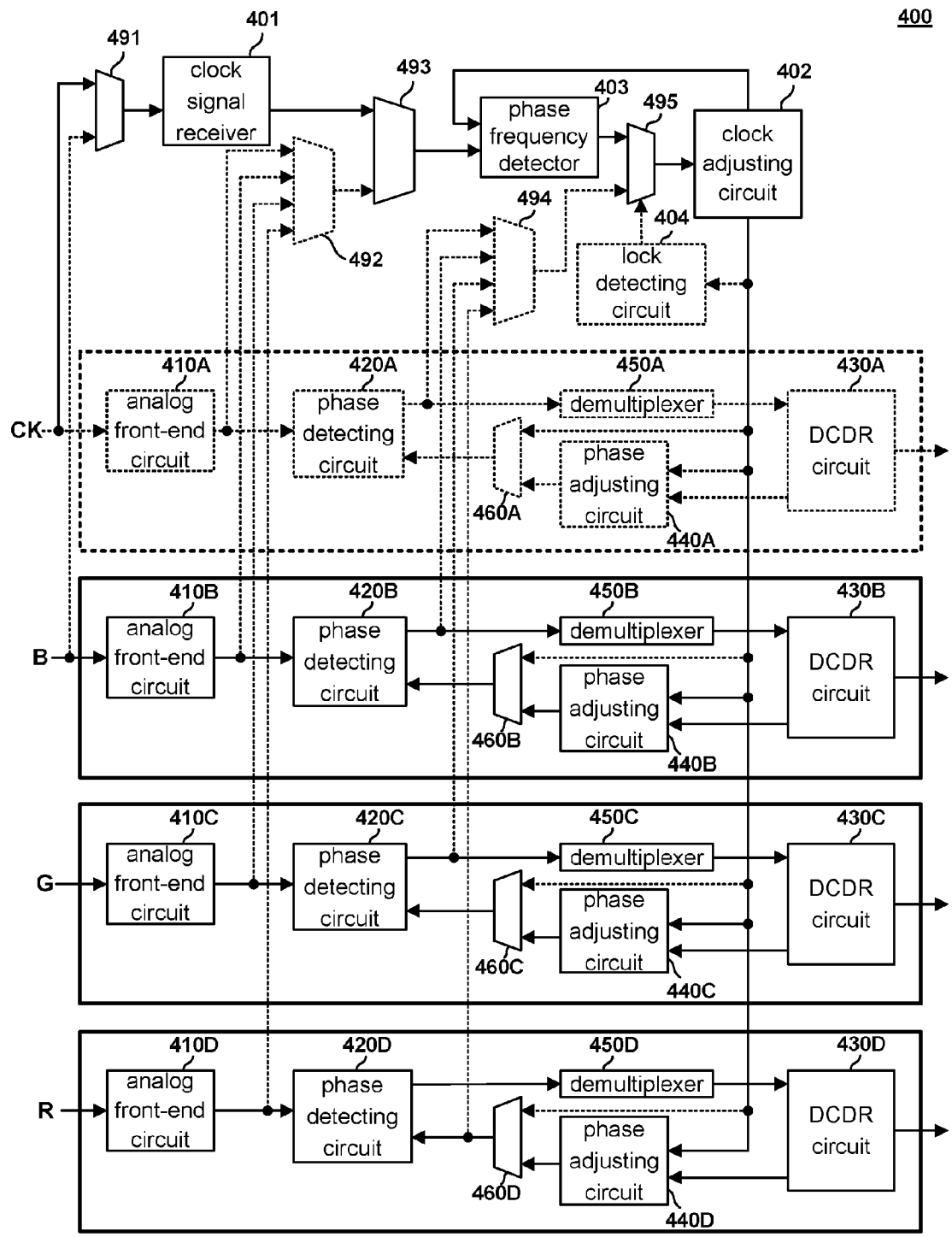
Figure 5A:
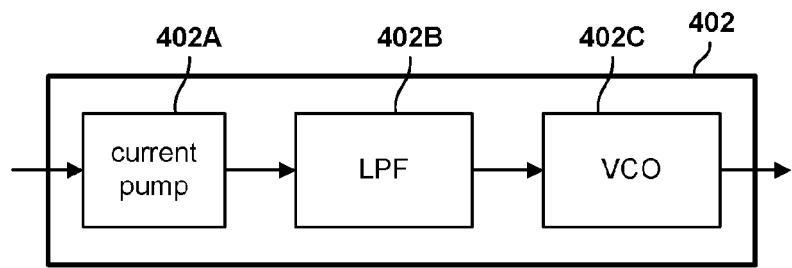
FIG. 5(A) to FIG. 5(C) are detailed examples of a clock adjusting circuit according to the present invention.
Figure 5B:
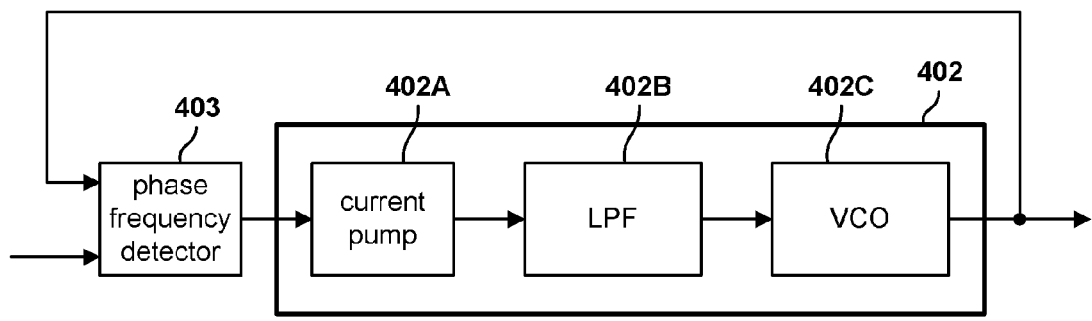

FIG. 4(B) illustrates operations of the multimedia interface receiving circuit 400 in an HDMI configuration. When the multimedia interface receiving circuit 400 is configured as an HDMI receiving circuit, the four pairs of differential signals inputted are respectively a clock signal CK, and image data signals B, G and R. In the above situation, the signal processing channel formed by the analog front-end circuit 410A, the phase detecting circuit 420A, the DCDR circuit 430A, the phase adjusting circuit 440A, the demultiplexing circuit 450A and the multiplexer 460A is disabled. As shown in FIG. 4(B), the multiplexer 491 selectively transmits the clock signal CK to the clock signal receiver 401, and the multiplexer 493 selectively transmits an output signal of the clock signal receiver 401 to the phase frequency detector 403. FIG. 5(A) shows an example of the clock adjusting circuit 402 according to an embodiment. At this point, the multiplexer 495 selectively connects an output end of the phase frequency detector 403 to the clock adjusting circuit 402, such that the phase frequency detector 403, a current pump 402A, a low-pass filter (LPF) 402B, a voltage-controlled oscillator (VCO) 402C form a phase-locked loop (PLL) shown in FIG. 5(B). According to the HDMI specification, the PLL generates a multiple frequency signal (as a locked clock signal) to the phase adjusting circuits 400B to 440D to serve as a fundamental clock signal for sampling. The lock detecting circuit 404 is disabled in the HDMI configuration.

Figure 1:
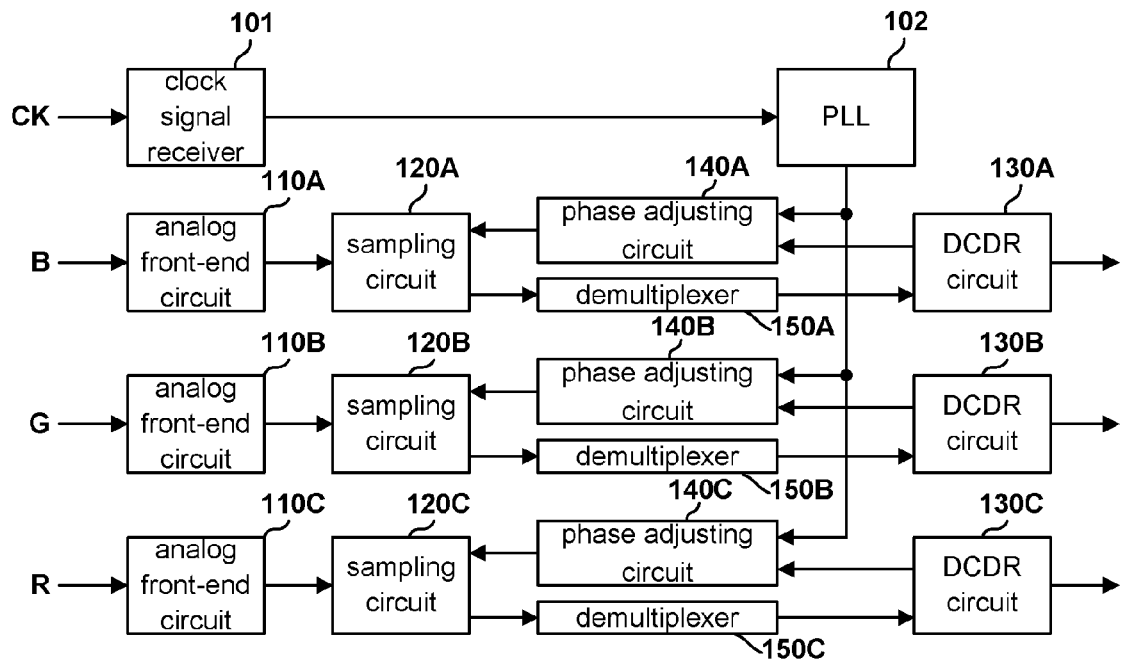
FIG. 1 is a function block of a front-end of a High-Definition Multimedia Interface (HDMI) receiving circuit.

The image data signals B, G and R are respectively provided to the analog front-end circuits 401B to 410D. The sampling circuits included in the phase detecting circuits 420B to 420D sample the input signals by the sampling clock signals provided by the phase adjusting circuits 440B to 440D. Through the demultiplexers 450B to 450D, the sample results generated by the phase detecting circuits 420B to 420D are respectively demultiplexed and transmitted to the DCDR circuits 430B to 430D. The DCDR circuits 430B to 430D detect whether the phase falls ahead or behind to generate respective phase determination results. The phase determination results are fed back to the corresponding phase adjusting circuits 440B to 440D, which then accordingly adjust the phase of the respective output signals (i.e., the sampling clock signals utilized by the phase detecting circuits 420B to 420D) to allow the phase detecting circuits 420B to 420D to generate preferred sample results. Further, in an HDMI configuration, the phase determining circuits included in the phase detecting circuits 420B to 420D are usually disabled, but may also be configured to generate signals indicating that the phase falls ahead or behind to the DCDR circuits 430B to 430D to assist in generating the phase determination results. Comparing FIG. 1 and FIG. 4(B), it is observed that, with the above signal connection arrangement, the multimedia interface receiving circuit 400 is equivalent to an HDMI receiving circuit. It should be noted that, detailed operations of the phase adjusting circuits and the DCDR circuits are known to one person skilled in the art, and shall be omitted herein.

Figure 4C:
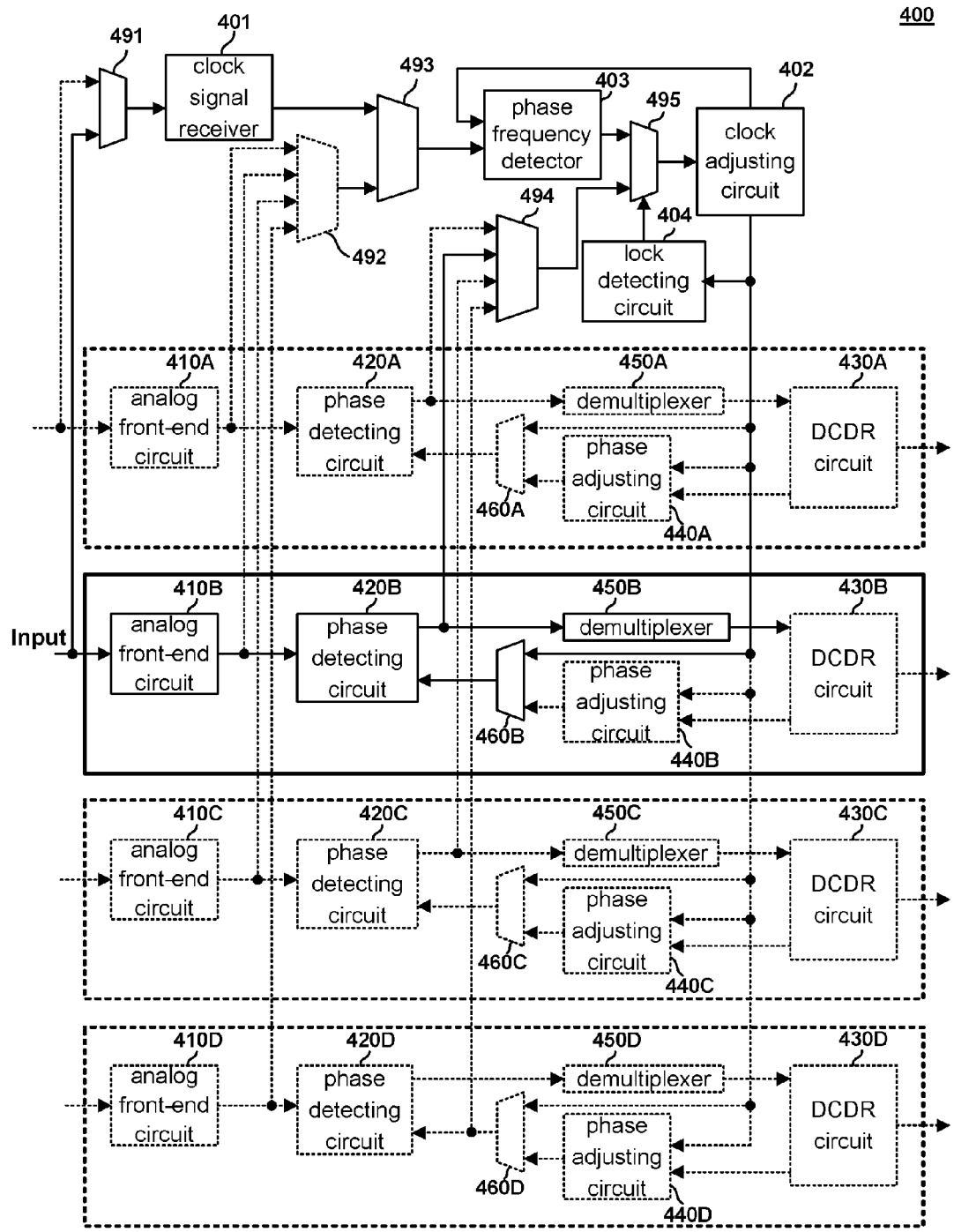

FIG. 4(C) illustrates operations of the multimedia interface receiving circuit 400 in an MHL configuration. When the multimedia interface receiving circuit 400 is configured as an MHL circuit, three of the signal processing channels are disabled, and only one pair of the differential signals Input are inputted to the receiving circuit. According to the MHL specification, the differential signals carry a data signal and common-mode clock signal. As shown in FIG. 4(C), the differential signals Input are provided to the analog front-end circuit 410B and the multiplexer 491. The multiplexer 491 selectively transmits the differential signals Input to the clock signal receiver 401 to extract the common-mode clock signal therein. Further, the multiplexer 493 selectively transmits the output signal of the clock signal receiver 401 to the phase frequency detector 403. In such configuration, the multiplexer 495 first connects the output end of the phase frequency detector 403 to the clock adjusting circuit 402, such that the phase frequency detector 403 and the clock adjusting circuit 402 form the PLL shown in FIG. 5(B).

Figure 2:
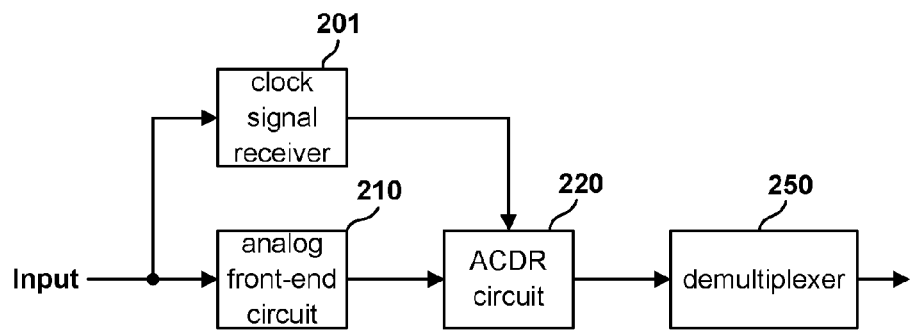
FIG. 2 is a function block of a front-end of a Mobile High-Definition Link (MHL) receiving circuit.
Figure 5C:
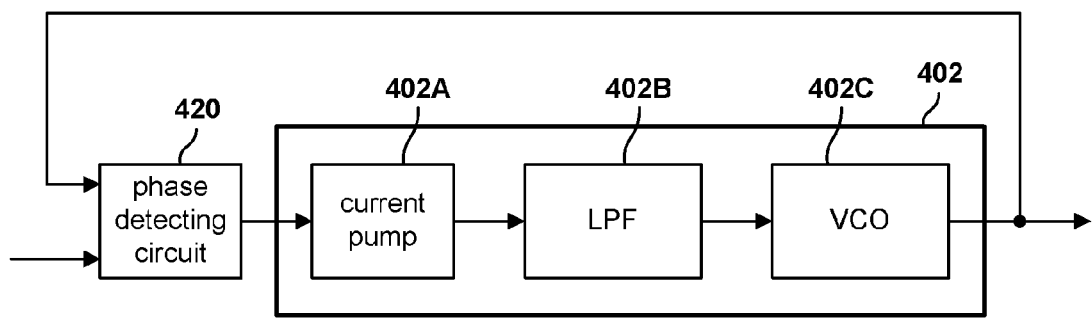

As shown in FIG. 4(C), in the MHL configuration, the multiplexer 494 constantly selects the output signal of the phase detecting circuit 402B. When the lock detecting circuit 404 determines that the PLL satisfies a lock condition (e.g., when the output frequency falls in a predetermined range), the lock detecting circuit 404 disables the phase frequency detector 403, and changes the multiplexer 495 to connect to the output end of the multiplexer 494 and the clock adjusting circuit 402, such that the phase detecting circuit 420B and the clock adjusting circuit 402 form an ACDR circuit shown in FIG. 5(C). Further, the differential signals Input are provided to the analog front-end circuit 410B to extract the data signal therein, transmitted to the phase detecting circuit 420B for sampling and phase detection, and further demultiplexed and transmitted to a subsequent circuit via the demultiplexer 450B. Comparing FIG. 2 and FIG. 4(C), it is observed that, with the above signal connection arrangement, the multimedia interface receiving circuit 400 is equivalent to an MHL receiving circuit.

Figure 4D:
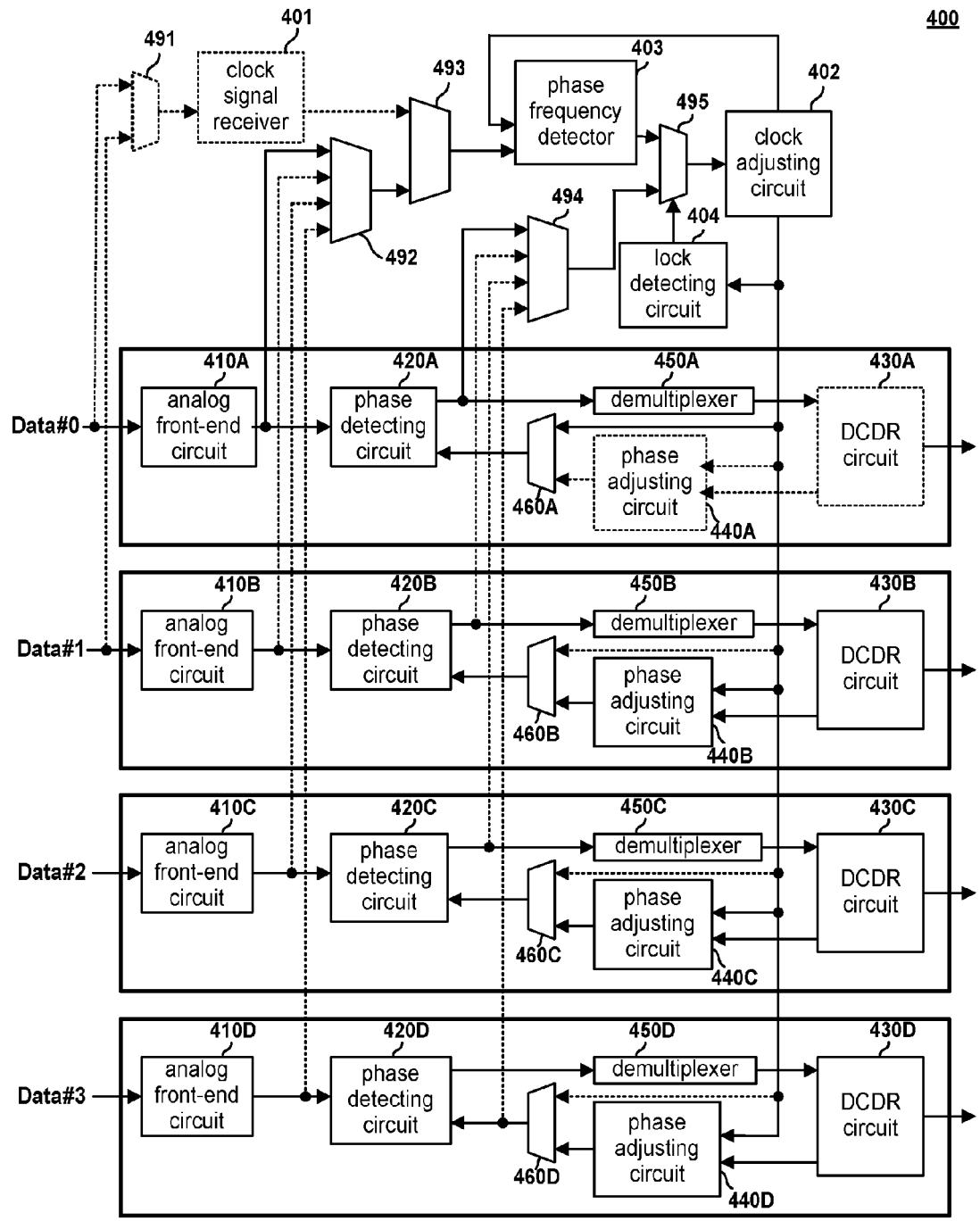

FIG. 4(D) illustrates operations of the multimedia interface receiving circuit 400 in a DisplayPort (DP) configuration. When the multimedia interface receiving circuit 400 is configured as a DP receiving circuit, four pairs of differential data image signals Data#0, Data#1, Data#2 and Data#3 are inputted to the analog front-end circuits 410A to 410D. The clock signal receiver 401 is disabled. The multiplexers 492 and 493 constantly provide the output signal of the analog front-end circuit 410A to the phase frequency detector 403. According to the DP specification, the four pairs of differential signals are initially clock signals during a beginning period. In other words, the output signal of the analog front-end circuit 410A is initially a clock signal during the beginning period. The multiplexer 495 first selectively connects the output end of the phase frequency detector 403 to the clock adjusting circuit 402, such that the phase frequency detector 403 and the clock adjusting circuit 402 form the PLL shown in FIG. 5(B) for locking the clock signal outputted from the analog front-end circuit 410A.

Figure 3:
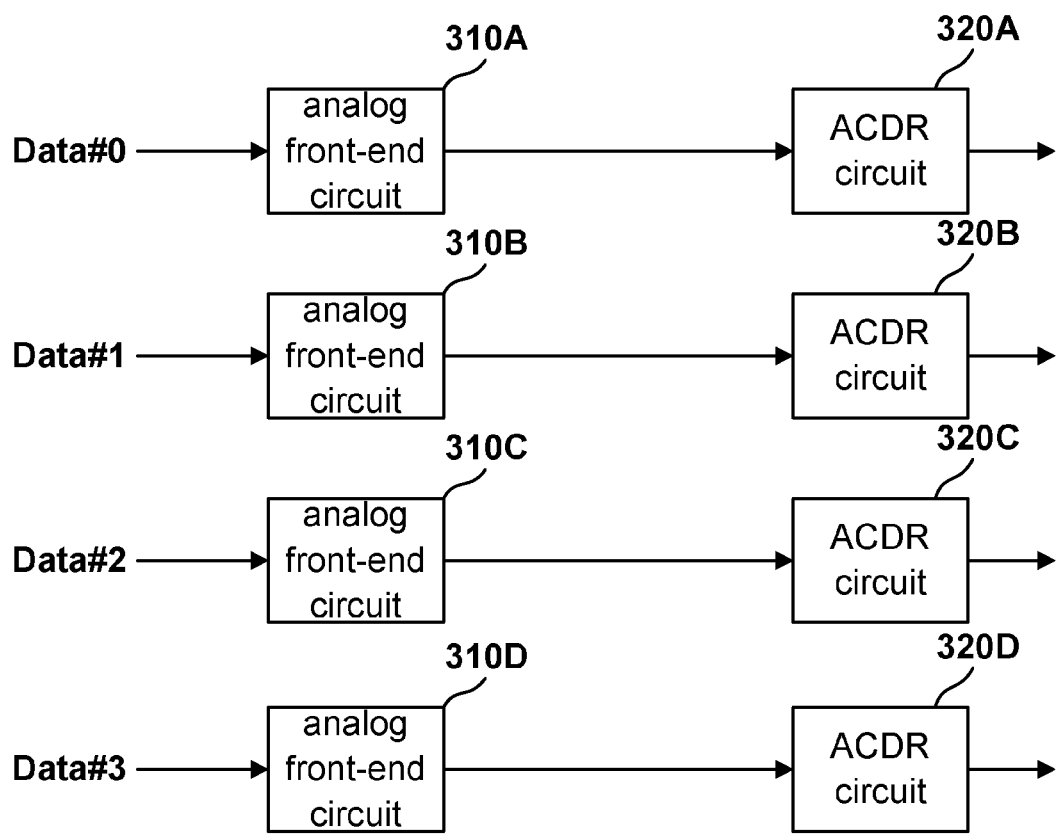
FIG. 3 is a function block of a front-end of a DisplayPort (DP) receiving circuit.

As shown in FIG. 4(D), in the DP configuration, the multiplexer 494 constantly selects the output signal of the phase detecting circuit 420A. When the clock detecting circuit 404 determines that the PLL satisfies a lock condition (e.g., when the output frequency falls in a predetermined range), the lock detecting circuit 404 changes to connect the multiplexer 495 to the output end of the multiplexer 494 and the clock adjusting circuit 402, such that the phase detecting circuit 402A and the clock adjusting circuit 402 form an ADCR circuit shown in FIG. 5(C). The ADCR circuit is equivalent to the ACDR circuit in FIG. 3. On the other hand, the output signal of the clock adjusting circuit 402 is also provided to the phase adjusting circuits 440B to 440D to serve as a fundamental clock signal for sampling clock signals. According to adjustment information provided by the DCDR circuits 430B to 430D, each of the phase adjusting circuits 440B to 440D adjusts the phase of the fundamental clock signal to generate a sampling clock signal. Comparing FIG. 3 and FIG. 4(D), it is observed that, with the above connection method, the multimedia interface receiving circuit 400 is equivalent to a DP receiving circuit, with a difference that ACDR is replaced by DCDR in the three latter processing channels.

In practice, the multimedia interface receiving circuit 400 may include a controller (not shown). The controller determines which circuit blocks are to be disabled/enabled according to the configuration of the multimedia interface receiving circuit 400 and provides the multiplexers with appropriate control signals. According to FIG. 4(B) to FIG. 4(D), one person skilled in the art can easily appreciate that the DCDR circuit 430A, the phase adjusting circuit 440A and the multiplexer 460A are optional elements. The design of four identical signal processing channels provides benefits of reducing circuit design complexities and maintaining flexibilities of later extending the multimedia interface receiving circuit 400 to another circuit configuration. Further, without considering verification tests, the multiplexer 492 is an optional element in general circuit operations, and may be replaced by a pure circuit connection line, i.e., the output signal of the analog front-end circuit 410A is directly connected to an input end of the multiplexer 493.

Compared to a conventional solution of including three independent HDMI, MHL and DP receiving circuits, the multimedia interface receiving circuit 400 effectively reduces hardware costs by appropriately sharing circuit elements.

Figure 6A:
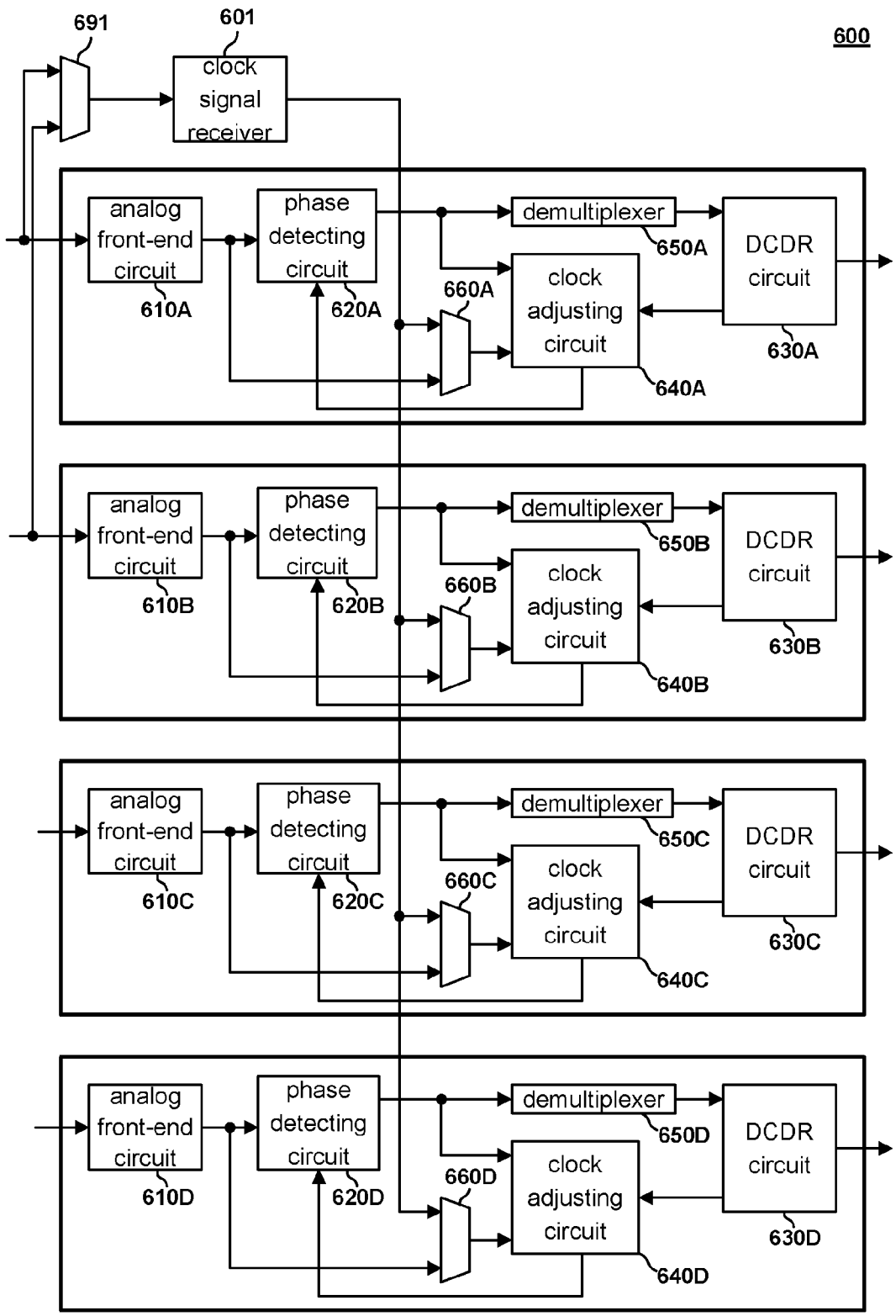
FIG. 6(A) to FIG. 6(D) are function block diagrams of a multimedia interface receiving circuit according to an embodiment of the present invention.

FIG. 6(A) shows a function block diagram of a multimedia interface receiving circuit 600 according to another embodiment of the present invention. The multimedia interface receiving circuit 600 includes a clock signal receiver 601, analog front-end circuits 610A to 610D, phase detecting circuits 620A to 620D, DCDR circuits 630A to 630D, clock adjusting circuits 640A to 640D, demultiplexers 650A to 650D, multiplexers 660A to 660D, and a multiplexer 691. Each of the phase detecting circuits 620A to 620D includes a sampling circuit and a phase detecting circuit (not shown). As shown in FIG. 6(A), the multimedia interface receiving circuit 600 receives four pairs of input signals, usually in form of differential signals, at input ends of the analog front-end circuits 610A to 610D. By appropriately and selectively controlling a signal connection arrangement of the multiplexers, the multimedia interface receiving circuit 600 may be set as an HDMI receiving circuit, an MHL receiving circuit or a DP circuit. Details are described below.

Figure 6B:
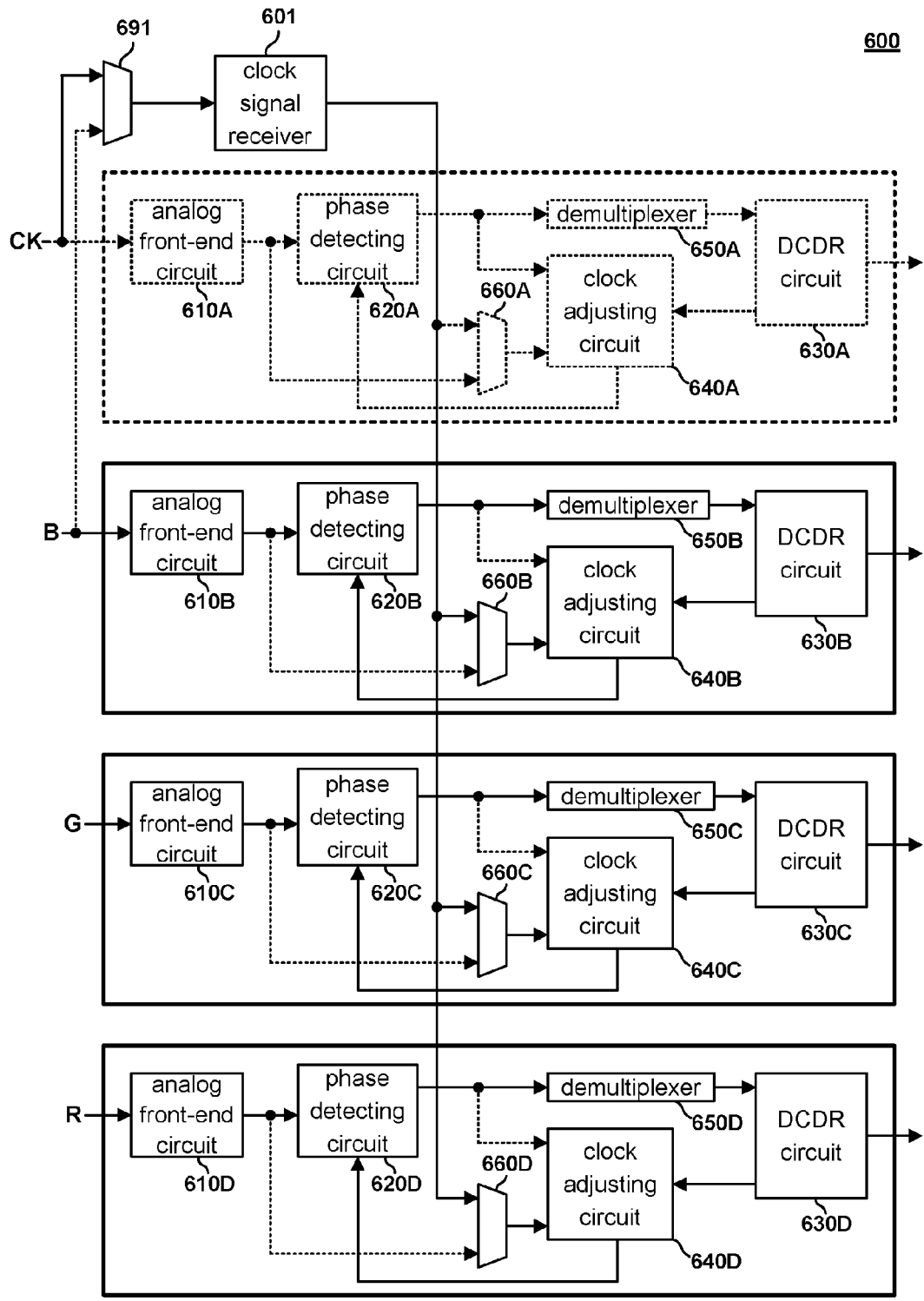

FIG. 6(B) illustrates operations of the multimedia interface receiving circuit 600 in an HDMI configuration. When the multimedia interface receiving circuit 600 is configured as an HDMI receiving circuit, four pairs of differential signals, including a clock signal CK and image data signals B, G and R, are inputted to the receiving circuit. At this point, the signal processing channel formed by the analog front-end circuit 610A, the phase detecting circuit 620A, the DCDR circuit 630A, the clock adjusting circuit 640A, the demultiplexer 650A and the multiplexer 660A is disabled. The multiplexer 691 selectively transmits the clock signal CK to the clock signal receiver 601, and the multiplexers 660B to 660D respectively transmit the output signal of the clock signal receiver 601 to the clock adjusting circuits 640B to 640D.

Figure 7A:
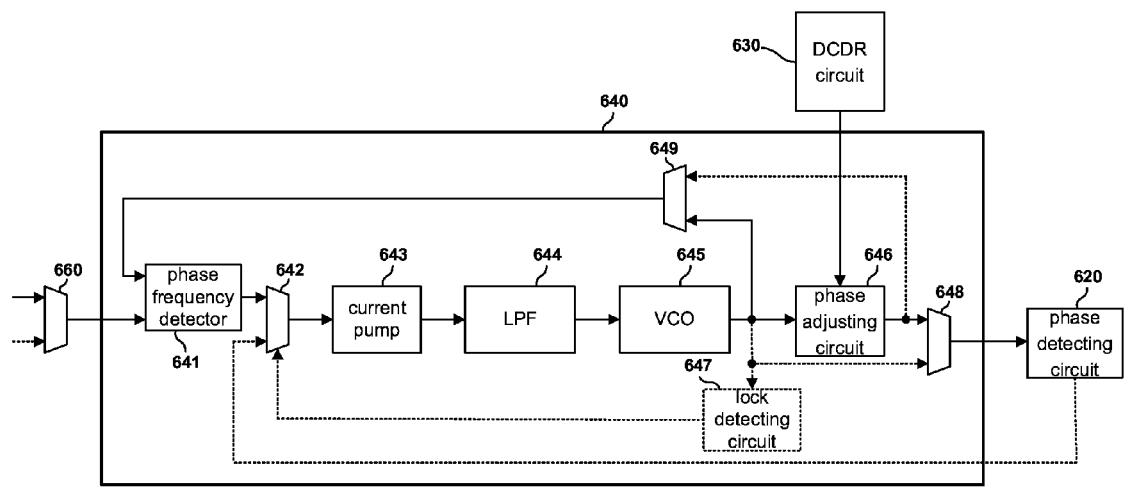
FIG. 7(A) to FIG. 7(D) are detailed examples of a clock adjusting circuit according to the present invention.
Figure 7B:
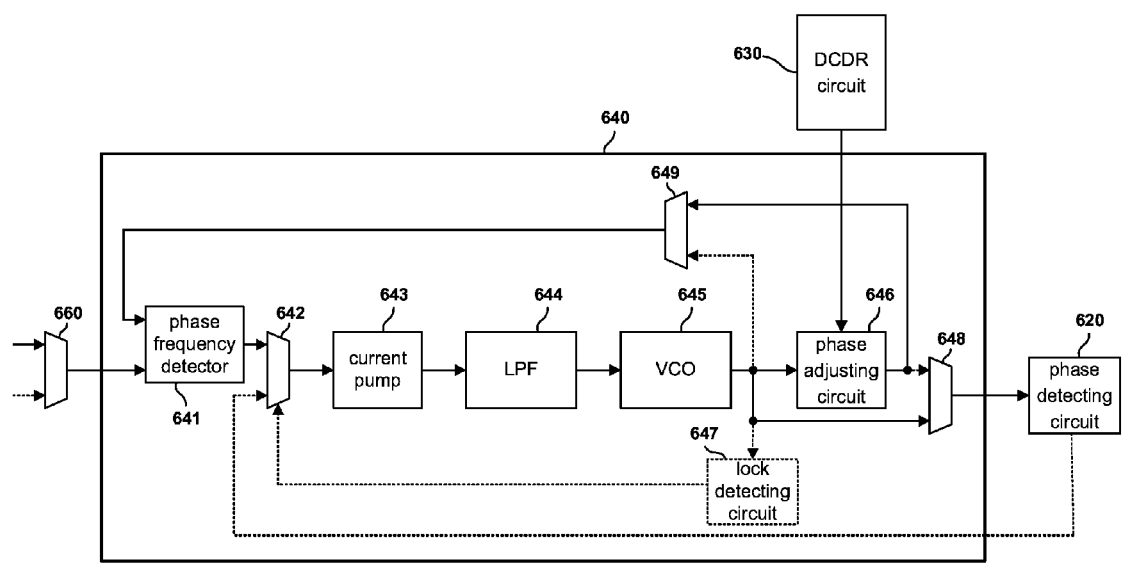

In an HDMI configuration, each of the clock adjusting circuits 640B to 640D (to be collectively referred to as a clock adjusting circuit 640) is configured to include a PLL. FIG. 7(A) to FIG. 7(B) show a detailed circuit example of the clock adjusting circuit 640, and corresponding relationships of a DCDR circuit 630, a multiplexer 660 and a phase detecting circuit 620. In this example, the clock adjusting circuit 640 includes a phase frequency detector 641, a multiplexer 642, a current pump 643, an LPF 644, a VCO 645, a phase adjusting circuit 646, a lock detecting circuit 647, a multiplexer 648 and a multiplexer 649. In this embodiment the clock adjusting circuit 640 may be set to two configurations. FIG. 7(A) shows the first configuration that has the multiplexer 649 selectively connect an output end of the VCO 645 to the phase frequency detector 641, such that the multiplexer 648 selectively connects an output end of the phase adjusting circuit 646 to the phase detecting circuit 620 and the multiplexer 642 selectively connects the phase frequency detector 641 to the current pump 643. At this point, the phase frequency detector 641, the current pump 643, the LPF 644 and the VCO 645 form a PLL for accordingly generating a fundamental clock signal (as a locked clock signal) that is then outputted to the phase adjusting circuit 646 by the VCO 645. The phase adjusting circuit 646 generates phase adjustment information according to a phase determination result generated by the DCDR circuit 630, and provides a phase adjusted signal to the phase detecting circuit 620 as a sampling clock signal. In the second configuration shown in FIG. 7(B), the multiplexer 648 selectively connects the output end of the phase adjusting circuit 646 to the phase frequency detector 641, the multiplexer 648 selectively connects the output end of the VCO 645 to the phase detecting circuit 620, and the multiplexer 642 selectively connects the phase frequency detector 641 to the current pump 643 to form another PLL that provides a sampling clock signal to the phase detecting circuit 620. Further, in the HDMI configuration, the phase determining circuits in the phase detecting circuits 620B to 620D are usually disabled, but may also generate signals indicating that the phase falls ahead or behind to the DCDR circuits 630B to 630D to assist in generating the phase determination results. With the above signal connection arrangement, the three signal processing channels in the multimedia interface receiving circuit 600 are equivalent to the signal processing channel in FIG. 1, with a difference being that each of the signal processing channels in the multimedia interface receiving circuit 600 includes a PLL.

Figure 6C:
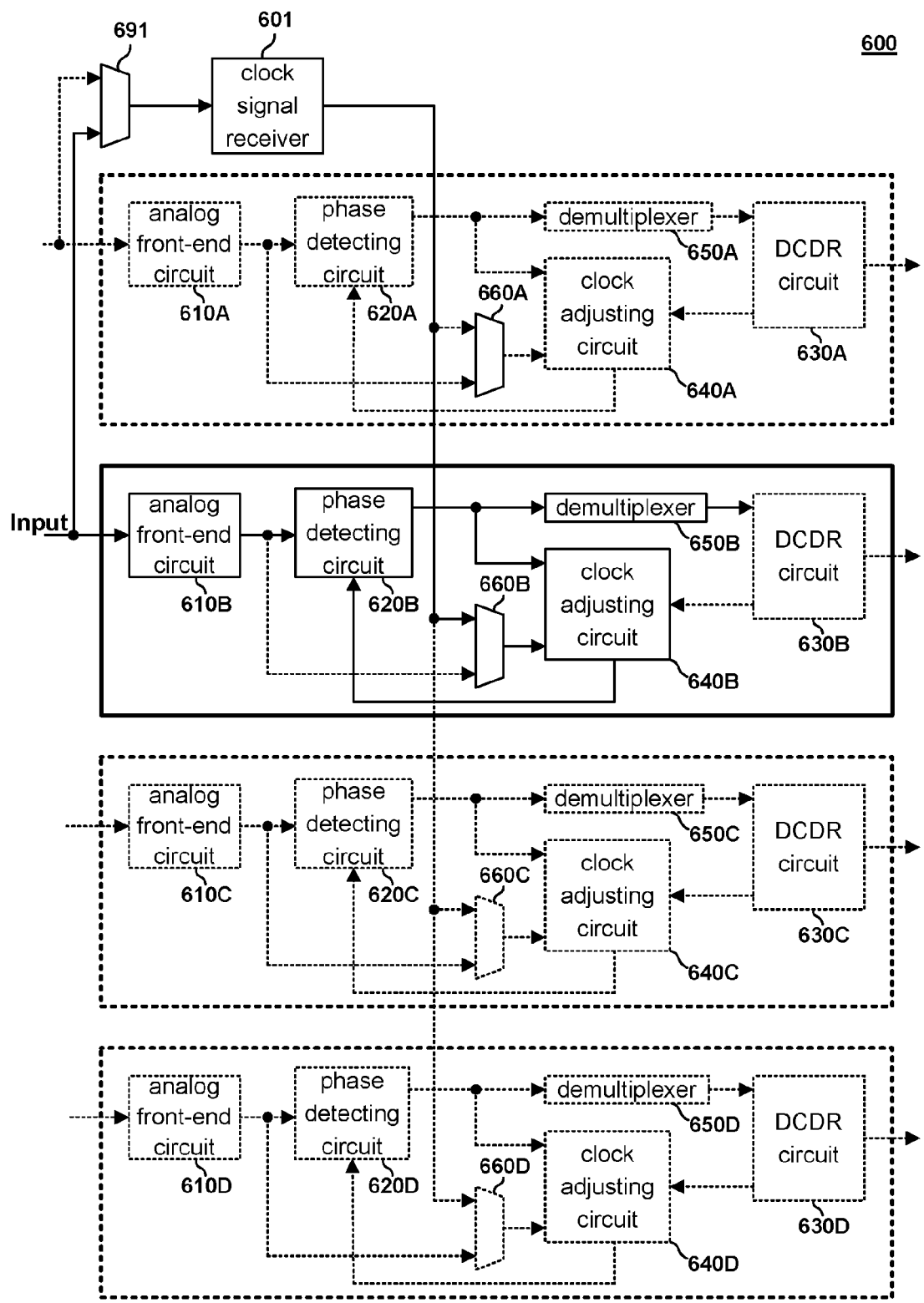
Figure 7C:
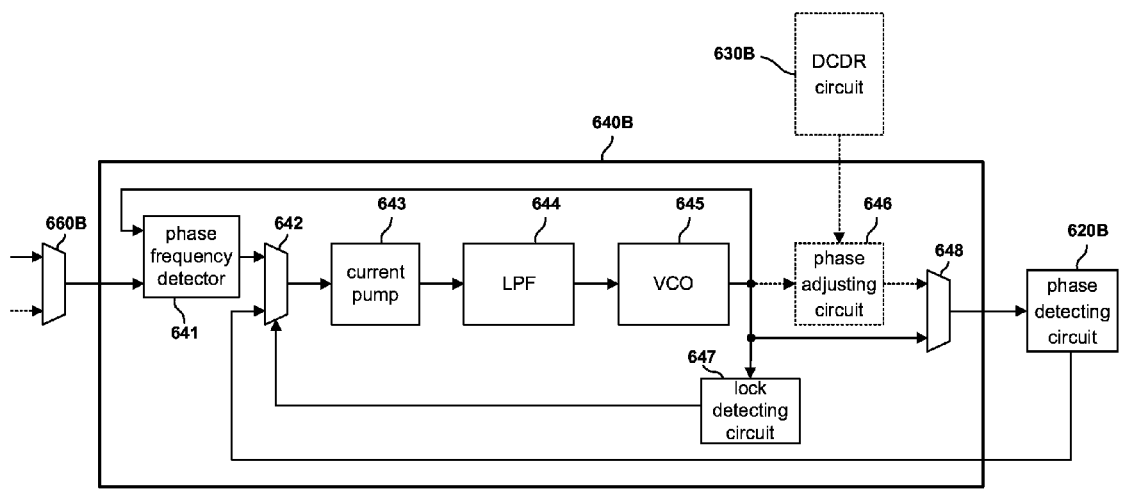

FIG. 6(C) illustrates operations of the multimedia interface receiving circuit 600 in an MHL configuration. When the multimedia interface receiving circuit 600 is configured as an MHL receiving circuit, three of the signal processing channels are disabled, and only one pair of differential signals are inputted to the receiving circuit. According to the MHL specification, the differential signals carry a data signal and a common-mode clock signal. As shown in FIG. 6(C), the differential signals are provided to the analog front-end circuit 610B and the multiplexer 691. The multiplexer 691 transmits the input signals to the clock signal receiver 601 to extract the common-mode clock signal therein. The multiplexer 660B constantly transmits the output signal of the clock signal receiver 601 to the clock adjusting circuit 640B. Taking the circuit example of the clock adjusting circuit 640 in FIG. 7(C) for example, in the MHL configuration, the lock detecting circuit 647 first controls the multiplexer 642 to connect the phase frequency detector 641 to the current pump 643, such that the phase frequency detector 641, the current pump 643, the LPF 644 and the VCO 645 form a PLL for locking the clock signal provided by the clock signal receiver 601. In the MHL configuration, the phase adjusting circuit 646 and the DCDR circuit 630B are disabled, and the multiplexer 648 connects the output end of the VCO 645 to the phase detecting circuit 620B. When the lock detecting circuit 647 determines that the above PLL is in a locked state, the lock detecting circuit 647 disables the phase frequency detector 641, and changes the multiplexer 642 to connect to the phase detecting circuit 620B and the current pump 643, such that the phase detecting circuit 620B, the current pump 643, the LPF 644 and the VCO 645 form an ADCR circuit. Further, the differential signals are also provided to the analog front-end circuit 610B to extract the data signal, transmitted to the phase detecting circuit 620B for the use of sampling and phase detection, and demultiplexed and transmitted to a subsequent circuit via the demultiplexer 450B. With the above signal connection arrangement, the multimedia interface receiving circuit 600 is equivalent to an MHL receiving circuit.

Figure 6D:
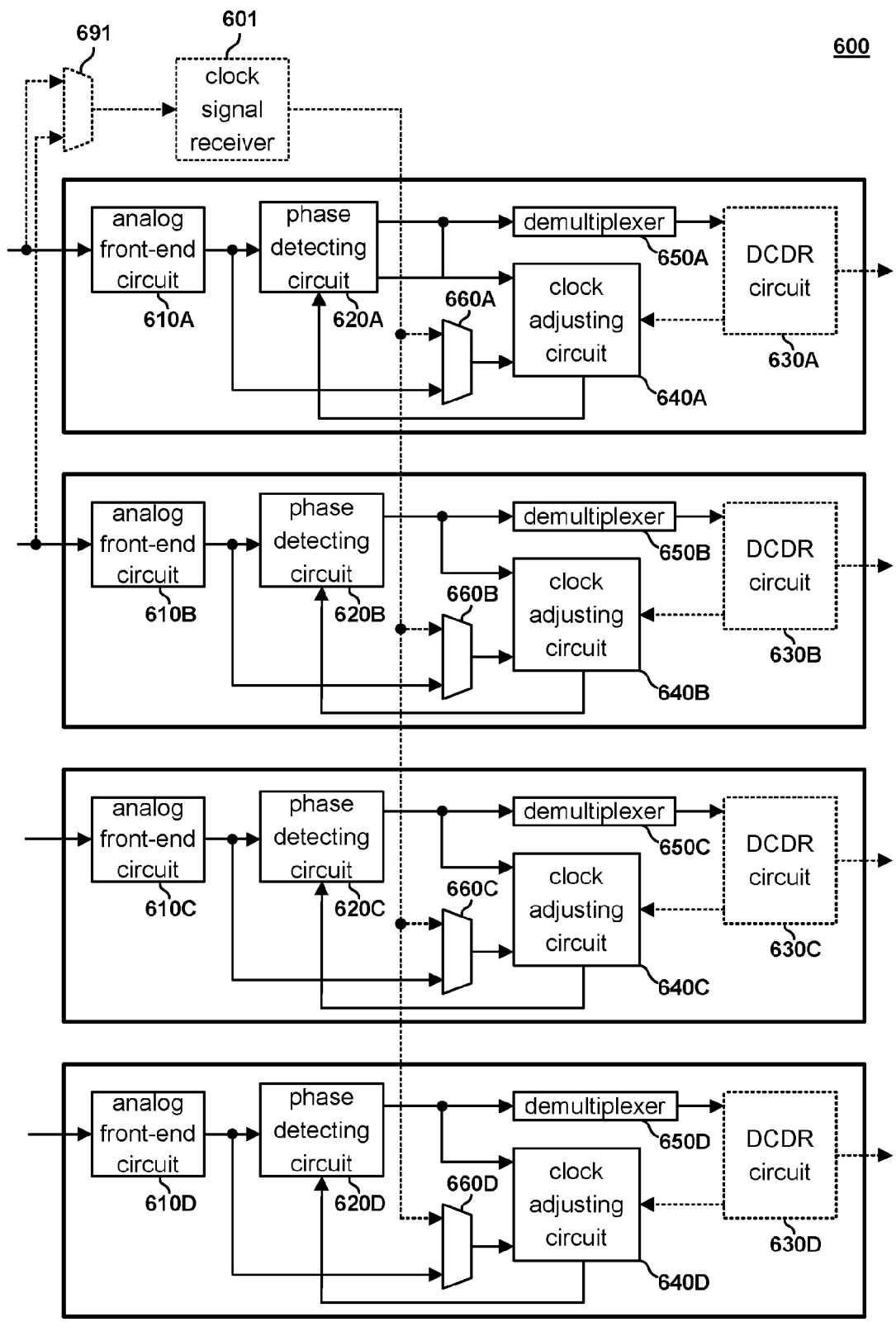
Figure 7D:
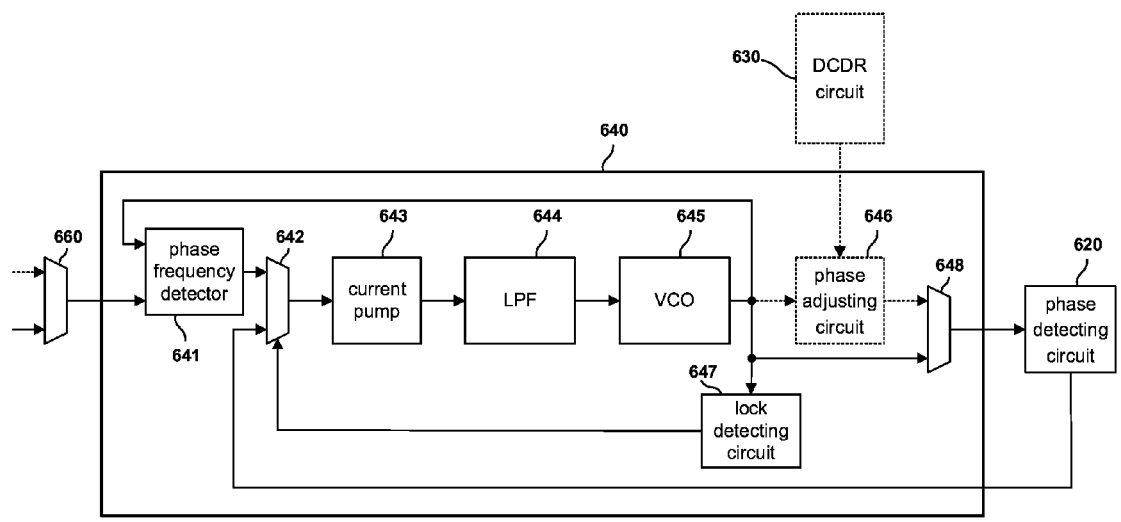

FIG. 6(D) illustrates operations of the multimedia interface receiving circuit 600 in a DP configuration. When the multimedia interface receiving circuit 600 is configured as a DP receiving circuit, four pairs of image data signals Data#0, Data#1, Data#2 and Data#3 are respectively inputted to the analog front-end circuits 610A to 610D. The clock signal receiver 601 is disabled. The multiplexers 660A to 660D constantly provide the output signals of the analog front-end circuits 610A to 610D to the clock adjusting circuits 640A to 640D, respectively. As previously stated, the signals Data#0 to Data#3 are initially clocks signals during a beginning period. Taking the circuit example of the clock adjusting circuit 640 in FIG. 7(D) for example, in the DP configuration, the lock detecting circuit 647 first controls the multiplexer 642 to connect the phase frequency detector 641 to the current pump 643, such that the phase frequency detector 641, the current pump 643, the LPF 644 and the VCO 645 form a PLL for locking the clock signal outputted by the analog front-end circuit 610. In the DP configuration, the phase adjusting circuit 646 and the DCDR circuit 630 are disabled, and the multiplexer 648 constantly connects the output end of the VCO 645 to the phase detecting circuit 620. When the lock detecting circuit 647 determines that the above PLL is in a locked state, the lock detecting circuit 647 disables the phase frequency detector 641, and changes the multiplexer 642 to connect to the phase detecting circuit 620 and the current pump 643, such that the phase detecting circuit 620, the current pump 643, the LPF 644 and the VCO 645 form a ACDR circuit. With the above signal connection arrangement, each of the four signal processing channels in the multimedia interface receiving circuit 600 is equivalent to one signal processing channel in FIG. 3.

In practice, the multimedia interface receiving circuit 600 may include a controller (not shown). The controller determines which circuit blocks are to be disabled/enabled according to the configuration of the multimedia interface receiving circuit 400 and provides the multiplexers with appropriate control signals. According to FIG. 6(B) to FIG. 6(D), one person skilled in the art can easily appreciate that the DCDR circuit 630A is an optional element. The design of four identical signal processing channels provides benefits of reducing circuit design complexities and maintaining flexibilities of later extending the multimedia interface receiving circuit 600 to another circuit configuration. Compared to a conventional solution of including three independent HDMI, MHL and DP receiving circuits, the multimedia interface receiving circuit 600 effectively reduces hardware costs by appropriately sharing circuit elements.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multimedia interface receiving circuit having multiple circuitry configurations, comprising:
   a phase-locked loop (PLL), comprising a phase frequency detector, configured to generate a fundamental clock signal; and
   four signal processing channels, each comprising:
   an analog front-end circuit, configured to receive a respective input signal and to accordingly generate a processed signal;
   a phase detecting circuit, configured to sample the processed signal to generate a sampled signal;
   a demultiplexer, configured to convert the sampled signal to a demultiplexed signal;
   a digital clock data recovery (DCDR) circuit, configured to perform a DCDR process on the demultiplexed signal to generate corresponding phase adjustment information;
   a phase adjusting circuit, configured to receive the phase adjustment information and the fundamental clock signal, and to adjust a phase of the fundamental clock signal according to the phase adjustment information to generate a sampling clock signal;
   a multiplexer, configured to selectively transmit one of the fundamental clock signal and the sampling clock signal to the phase detecting circuit according to the configuration of the multimedia interface receiving circuit;
   in a High-Definition Multimedia Interface (HDMI) configuration:
      one of the signal processing channels is disabled, and each of the other three signal processing channels receives one of the respective input signals, and the PLL provides the fundamental clock signal to the other three signal processing channels; and
   in a DisplayPort (DP) configuration:
      the PLL is configured so that when the PLL satisfies a lock condition, the phase frequency detector in the PLL is disabled, and the PLL changes to be connected to receive the sampled signal generated by the phase detecting circuit in one of the four signal processing channels in order to form an analog clock data recovery (ACDR) circuit to generate the fundamental clock signal for the DP configuration that is provided to the other three signal processing channels.

2. The multimedia interface receiving circuit according to claim 1, further comprising a Mobile High-Definition Link (MHL) configuration, and in the MHL configuration:
   three of the four signal processing channels are disabled; and
   the PLL is configured so that when the PLL satisfies the lock condition, the phase frequency detector in the PLL is disabled, and the PLL changes to be connected to receive the sampled signal generated by the phase detecting circuit of the non-disabled signal processing channel in order to form the ACDR circuit to generate the fundamental clock signal for the MHL configuration.

3. The multimedia interface receiving circuit according to claim 2, further comprising:
   a clock signal receiver;
   in the HDMI configuration, the clock signal receiver receives a clock signal, and provides a corresponding processed clock signal to the phase frequency detector;
   in the MHL configuration, the clock signal receiver receives a differential signal, and extracts a common-mode clock signal from the differential signal that is provided to the phase frequency detector; and
   in the DP configuration, the clock signal receiver is disabled.

4. A multimedia interface receiving circuit having multiple circuitry configurations, comprising:
   a clock signal receiver; and
   four signal processing channels, each comprising:
   a phase locked loop (PLL);
   an analog front-end circuit, configured to receive a respective input signal and to accordingly generate a processed signal;
   a phase detecting circuit, configured to sample the processed signal to generate a sampled signal;
   a demultiplexer, configured to convert the sampled signal to a demultiplexed signal;
   a digital clock data recovery (DCDR) circuit, configured to perform a DCDR process on the demultiplexed signal to generate corresponding phase adjustment information;
   a clock adjusting circuit, the PLL being comprised in the clock adjusting circuit;
   a multiplexer, configured to selectively connect an output signal of the clock signal receiver or the processed signal from the respective analog front-end circuit to the respective clock adjusting circuit according to the configuration of the multimedia interface receiving circuit;
   in a High-Definition Multimedia Interface (HDMI) configuration:
      one of the signal processing channels is disabled;
      the PLLs of each of the other three signal processing channels are each configured to generate a locked clock signal and adjust a phase of the locked clock signal according to the phase adjustment information provided by the respective DCDR circuit in order to generate a sampling clock signal for the respective phase detecting circuit; and
      the clock signal receiver receives a clock signal and provides a corresponding processed clock signal to the non-disabled PLLs in each of the other three signal processing channels using the respective multiplexer;
   in a DisplayPort (DP) configuration:
      each of the PLLs is configured so that when the PLLs of each of the four signal processing channels satisfies a lock condition, a phase frequency detector in each of the PLLs is disabled, and each of the PLLs changes to be connected to receive the sampled signal generated by the respective phase detecting circuit of the corresponding signal processing channel to form a respective analog clock data recovery (ACDR) circuit for the DP configuration; and
      the clock signal receiver is disabled; and
   in a Mobile High-Definition Link (MHL) configuration:
      three of the four signal processing channels are disabled;
      the PLL of the non-disabled signal processing channel is configured so that when the lock condition is satisfied, the phase frequency detector in the PLL is disabled, and the PLL changes to be connected to receive the sampled signal generated by the phase detecting circuit of the non-disabled signal processing channel to form the ADCR circuit for the MHL configuration; and
      the clock signal receiver receives a differential signal, and extracts a common-mode clock signal from the differential signal that is provided to the PLL in the non-disabled signal processing channel using the respective multiplexer.

* * * * *